United States Patent [19]

Bult

[11] 4,002,505

[45] Jan. 11, 1977

[54] STABILIZATION OF ALUMINUM ARSENIDE

[75] Inventor: Roelof P. Bult, Fruitvale, Canada

[73] Assignee: Cominco Ltd., Vancouver, Canada

[22] Filed: July 28, 1975

[21] Appl. No.: 599,514

[30] Foreign Application Priority Data

June 20, 1975 Canada .............................. 229814

[52] U.S. Cl. .............................. 148/20.3; 75/134 T; 75/134 P; 75/138; 148/1.5; 148/32; 252/62.3 GA

[51] Int. Cl.$^2$ .......................................... C22F 1/02

[58] Field of Search ................ 148/13.1, 20.3, 1.5, 148/32; 75/138, 134 T, 134 P; 252/62.36 A

[56] References Cited

UNITED STATES PATENTS 2,938,816  5/1960  Gunther .............................. 148/1.5

*Primary Examiner*—R. Dean
*Attorney, Agent, or Firm*—Arne I. Fors

[57] ABSTRACT

Aluminum arsenide crystals, wherein gallium has been substituted for a minor portion of aluminum and which may be represented by the general formula $Al_{1-x}Ga_xAs$ wherein $x$ has values in the range of 0.02 to 0.30, are annealed at a temperature of at least 700° C in presence of arsenic vapor whereby the stability of the crystals against attack by moisture is improved.

6 Claims, No Drawings

STABILIZATION OF ALUMINUM ARSENIDE

BACKGROUND OF THE INVENTION

This invention relates to the preparation of aluminum arsenide type semiconductor material and, more particularly to a method for the preparation of stable crystals of aluminum gallium arsenide compositions.

Aluminum arsenide is a III–V compound semiconductor and is an advantageous material for the manufacture of optoelectronic devices, such as light emitting diodes. Similar compounds such as gallium arsenide, gallium phosphide, or gallium arsenide phosphide, are widely used in such manufacture, but the application of aluminum arsenide has been limited. The limitations in the application of aluminum arsenide are caused by difficulties in the preparation of high-purity single crystals, the reactivity of aluminum and the instability of crystals when exposed to moisture, such as, for example, contained in ambient air.

Aluminum arsenide can be prepared using well known methods, such as liquid and vapor-phase epitaxy techniques or melt-growth techniques. However, aluminum arsenide crystals prepared by these methods are generally unstable and generate arsine when exposed to moist air.

It is known that the binary compound gallium arsenide is chemically stable, while mixtures of gallium arsenide and aluminum arsenide, which form pseudo-binary or ternary compounds of aluminum, gallium and arsenic, are stable only at certain levels of their aluminum arsenide content. Thus, it has been reported that aluminum arsenide may be chemically stabilized by substituting gallium for 30 to 40 % of the aluminum. These substituted compounds have a composition which may be represented by the general formula $Al_{1-x}Ga_xAs$, wherein x has values of between 0.3 and 0.4. It has generally not been possible, however, to prepare stable semiconductor crystals having this formula wherein x has values of less than 0.3, i.e., wherein the gallium arsenide content is less than 30 mole percent.

We have now found that aluminum arsenide crystals, wherein gallium has been substituted for a minor portion of aluminum, i.e. less than 30% of the aluminum, can be prepared which have improved chemical stability.

It is therefore an object of the present invention to provide a method for the preparation of crystals of aluminum arsenide, wherein gallium has been substituted for a minor portion of the aluminum, which have improved chemical stability.

It is another object of the present invention to provide a method for the preparation of pseudo-binary crystals of aluminum gallium arsenide which contain 30 mole percent or less gallium arsenide and which are stable under ambient conditions.

It is still another object to stabilize aluminum gallium arsenide semiconductor crystals, which contain 30 mole percent or less gallium arsenide.

These and other objects of the invention and the manner in which they can be attained will become apparent from the following detailed description of the method of the invention.

SUMMARY OF THE INVENTION

According to the method of the invention, there is provided an improvement in the method for the preparation of aluminum arsenide crystals wherein gallium is substituted for a minor portion of aluminum, said crystals being represented by the general formula $Al_{1-x}Ga_xAs$ wherein x has values in the range of from about 0.02 to 0.30 which comprises annealing said crystals at a temperature of at least 700° C. in presence of arsenic vapour.

The invention will now be described in detail.

DESCRIPTION OF THE PREFERRED EMBODIMENTS

Aluminum gallium arsenide crystals, having the general formula $Al_{1-x}Ga_xAs$ wherein x has values in the range of from about 0.15 to 0.30, are prepared by using the solution-growth technique. This technique, briefly, comprises the addition of aluminum and arsenic to a bath of molten gallium at elevated temperature to produce a saturated solution of aluminum and arsenic in gallium, slowly cooling the bath whereby aluminum gallium arsenide crystals are formed and separating the formed crystals. By varying the ratio of concentrations of aluminum and arsenic in the melt in a predetermined manner and by varying the rate of cooling the values of x can be altered in the above stated range.

Aluminum gallium arsenide crystals, having the general formula $Al_{1-x}Ga_xAs$ wherein x has values in the range of about 0.02 to 0.15 are prepared by the solute-diffusion-growth technique. This technique, briefly, comprises heating aluminum and gallium at temperatures of about 1,000° to 1,050° C under arsenic vapour-pressure in a sealed quartz ampoule while maintaining a temperature gradient along the molten charge.

The methods for the preparation of aluminum gallium arsenide crystals, as described above, are not intended to limit the scope of this invention.

When $Al_{1-x}Ga_xAs$ crystals, x having values between about 0.02 and 0.30, are exposed to atmospheric conditons, i.e., are placed in ambient air which contains moisture, decomposition occurs at varying rates. The rates are dependent on the crystal compositions and increase with decreasing values of x. The decomposition in the form of evolution of arsine can be observed by placing crystals in ambient air in presence of test paper which is highly sensitive to arsine. Table I illustrates the increasing decomposition of $Al_{1-x}Ga_xAs$ crystals with decreasing values of x when exposed to ambient air in presence of arsine test paper.

TABLE I

| Composition of $Al_{1-x}Ga_xAs$ Values of x | Test Results Discoloration of Test Paper |
| --- | --- |
| 0.25 – 0.30 | No staining in 1 month |
| 0.20 – 0.25 | Slight yellow color in 1–3 days |
| 0.15 – 0.20 | Brown color in 1–3 days |
| 0.10 – 0.15 | Black stain in 1 day |
| 0.02 – 0.10 | Black stain in 1 hour |

We have found that the rate of decomposition can be lowered considerably by subjecting the crystals to an annealing treatment. The annealing can be accomplished by heating aluminum gallium arsenide crystals in the presence of arsenic at elevated temperature for a predetermined period of time.

Aluminum gallium arsenide crystals are placed in an alumina boat in a quartz ampoule in the presence of an amount of arsenic sufficient to provide an arsenic vapour-pressure of about 1 kg/cm² at the annealing temperature. The ampoule is evacuated, sealed and then heated at the desired temperature for the desired length of time.

Annealing at a temperature of below 700° C has no noticeable effect on the stability of the crystals, i.e, decomposition rate in ambient air, but when the annealing temperature is raised above 700° C the decomposition rate is retarded, as verified with arsine test paper. The preferred range of temperatures for the annealing is about 800° to 1,050° C, the most preferred range being about 1,000° to 1,050° C.

The length of time required for effecting satisfactory annealing of the crystals ranges up to 3 days, the preferred period being about 1 to 3 days.

When annealed at temperatures in the range of about 1,000° to 1,050° C for a period of from about 2 to 3 days and under an arsenic pressure of about 1 kg/cm$^2$, crystals of $Al_{1-x}Ga_xAs$, wherein x has values in the range of about 0.15 to 0.30, do not generate arsine when exposed to ambient air containing moisture and are stable. Crystals of $Al_{1-x}Ga_xAs$, wherein x has values in the range of about 0.02 to 0.15 have a much improved stability after annealing under the preferred conditions. The improvement can be seen by comparing the test results presented in Table I with those presented in Table II below.

TABLE II

| Composition of $Al_{1-x}Ga_xAs$ values of x | Test Conditions | Test Results Discoloration of test Paper |
|---|---|---|
| 0.15 – 0.30 | 1000° C, 2 days, 1 kg/cm$^2$As | no discoloration |
| 0.13 | 1000° C, 2 days, 1 kg/cm$^2$As | yellow color after 1 day |
| 0.02 | 1050° C, 3 days, 1 kg/cm$^2$As | slight yellow color after 1 hour |

What we claim as new and desire to protect by Letters Patent of the United States is:

1. In a method for the preparation of aluminum gallium arsenide crystals having improved chemical stability, said crystals being represented by the general formula $Al_{1-x}Ga_xAs$ wherein x has values in the range of about 0.02 to 0.30, the improvement which comprises annealing said crystals at a temperature in the range of from 700° to 1050° C. in the presence of arsenic vapour at an arsenic vapour pressure of about 1 kg/cm$^2$.

2. The improvement as claimed in claim 1, wherein said temperature is in the range of about 800° to 1050° C.

3. The improvement as claimed in claim 1 wherein the temperature is in the range of about 1000° to 1050° C.

4. The improvement as claimed in claim 1 wherein the annealing is performed over a period of time of up to about 3 days.

5. A method for the preparation of aluminum gallium arsenide crystals which comprises preparing crystals of $Al_{1-x}Ga_xAs$ wherein x has values in the range of about 0.02 to 0.30 and treating said crystals at a temperature in the range of about 1000° to 1050° C. in the presence of an amount of arsenic sufficient to provide an arsenic vapour pressure of about 1 kg/cm$^2$ for a period of time in the range of about 1 to 3 days whereby the stability of the crystals against attack by moisture is improved.

6. Aluminum gallium arsenide crystals, said crystals being represented by the general formula $Al_{1-x}Ga_xAs$ wherein x has values in the range of about 0.02 to 0.30, as prepared by the method of claim 1, said crystals having improved stability against attack by moisture.

* * * * *